United States Patent [19]
Hubbard et al.

[11] Patent Number: 5,898,479
[45] Date of Patent: Apr. 27, 1999

[54] SYSTEM FOR MONITORING OPTICAL PROPERTIES OF PHOTOLITHOGRAPHY EQUIPMENT

[75] Inventors: Walter Bryan Hubbard, San Antonio; Rosanna Kirk, Pflugerville, both of Tex.

[73] Assignee: VLSI Technology, Inc., San Jose, Calif.

[21] Appl. No.: 08/891,402

[22] Filed: Jul. 10, 1997

[51] Int. Cl.$^6$ .......................... G03B 27/34; G03B 27/42
[52] U.S. Cl. ............................... 355/61; 355/53; 355/55; 356/125
[58] Field of Search ................... 355/53, 55, 59, 355/61, 62; 250/548, 201.2; 356/124, 125; 430/5, 22, 30

[56] References Cited

U.S. PATENT DOCUMENTS

| | | |
|---|---|---|
| 4,585,342 | 4/1986 | Lin et al. . |
| 4,614,864 | 9/1986 | Wu . |
| 4,636,626 | 1/1987 | Hazama et al. . |
| 4,645,338 | 2/1987 | Juliana, Jr. et al. . |
| 4,701,606 | 10/1987 | Tanimoto et al. . |
| 4,725,722 | 2/1988 | Maeda et al. . |
| 4,728,785 | 3/1988 | Ohnuki et al. . |
| 4,759,626 | 7/1988 | Kroko . |
| 5,049,925 | 9/1991 | Alton et al. . |
| 5,078,492 | 1/1992 | Scheer . |
| 5,191,200 | 3/1993 | van der Werf et al. . |
| 5,266,790 | 11/1993 | Markle et al. . |
| 5,286,963 | 2/1994 | Torigoe . |
| 5,362,585 | 11/1994 | Adams . |
| 5,383,018 | 1/1995 | Sadjadi . |
| 5,432,331 | 7/1995 | Wertheimer . |
| 5,437,948 | 8/1995 | Minghetti et al. . |
| 5,448,332 | 9/1995 | Sakakibara et al. . |
| 5,466,549 | 11/1995 | Yamada . |
| 5,723,238 | 3/1998 | Moore et al. .............................. 430/30 |

OTHER PUBLICATIONS

Brochure, Cannon–FPA–3000 i4 Fine Pattern Aligner, High NA, High Throughput 5x i–Line Stepper. (Copyright date 1995).

*Primary Examiner*—Alan A. Mathews
*Attorney, Agent, or Firm*—Woodard, Emhardt, Naughton, Moriarty & McNett

[57] ABSTRACT

A focus evaluation technique for photolithography equipment is disclosed. This technique includes providing a substrate having a photoresist coating for treatment by the equipment. The equipment is activated to focus a first part of a image on a region of the surface and defocus a second part of the image relative to the region. The region is tilted relative to an image plane defined by the equipment. This activation is repeated for each of a number of spaced-apart regions along the surface. The substrate is processed to provide a pattern for each of the regions corresponding to the first and second parts. The equipment is characterized from the pattern for each of the regions. This characterization may result from inspection of the pattern relative to reference marks provided for each region. Focus information for the equipment which accounts for lens heating may be determined from this inspection.

38 Claims, 6 Drawing Sheets

SYSTEM FOR MONITORING OPTICAL PROPERTIES OF PHOTOLITHOGRAPHY EQUIPMENT

BACKGROUND OF THE INVENTION

The present invention relates to lithography equipment for processing semiconductor wafers.

Step and repeat lithography devices—sometimes called "wafer steppers"—facilitate the mass production of Integrated Circuits (ICs). Typically, this equipment projects an image onto a photosensitive coating of a semiconductor wafer to impart a corresponding pattern. This pattern may be used to selectively etch or deposit material to form desired semiconductor devices. U.S. Pat. No. 5,448,332 to Sakakibara et al.; U.S. Pat. No. 5,286,963 to Torigoe; and U.S. Pat. No. 5,191,200 to Van Der Werf et al. provide representative examples of lithographic equipment used for IC manufacture.

Proper focus is an important aspect of wafer stepper performance. Unfortunately, most conventional focusing schemes are time intensive, complex, and fail to evaluate focus under typical production conditions. As a result, equipment focus variation during production, such as might result from the gradual heating of equipment lenses, is generally not characterized as well as otherwise desired.

Thus, a need exists for a technique to evaluate lithographic equipment that accounts for production conditions in a simple, cost-effective manner. The present invention satisfies this demand and provides other significant advantages and benefits.

SUMMARY OF THE INVENTION

The present invention relates to evaluation of the lithography equipment. Various aspects of the invention are novel, non-obvious, and provide various advantages. While the actual nature of the invention covered herein may only be determined with reference to the claims appended hereto, certain features which are characteristic of the preferred embodiment disclosed herein are described briefly as follows.

In one feature of the present invention, a technique for determining an optical characteristic of an integrated circuit lithography device is provided. This technique includes successively exposing a number of locations on a photoresist layer to an image projected with the device to define a corresponding array of exposed fields. The layer is inclined a predetermined amount relative to an optical axis of the device during this exposure to focus only a portion of the image on the layer for each of the fields. The layer is processed to provide a pattern corresponding to the focused image portion for each of the fields. An optical characteristic of the device is determined from inspection of the pattern. Data gathered from this inspection may be employed to determine "best focus" of the device under realistic operating conditions in a manner that accounts for lens heating.

In a further feature, a photoresist layer on a substrate is exposed to an image projected with lithography equipment along an optical axis. The substrate is controllably titled relative to the axis during this exposure to focus a first part of the image on the photoresist and defocus a second part of the image relative to the photoresist. The photoresist is processed to provide a pattern corresponding to the first and second parts. A number of reference marks to determine position of a feature defined by the pattern are established and the pattern is inspected relative to the marks to determine an optical characteristic of the equipment. For example, this inspection may be used to evaluate equipment focus.

In another feature of the present invention, an evaluation system for lithography equipment used to manufacture integrated circuits from a semiconductor wafer is provided. This system includes a controllable positioning device configured to receive a test substrate having a photoresist layer. The system also includes a controllable image projection apparatus configured to project an image along an optical axis and onto the photoresist layer when the device receives the substrate. A processor operatively coupled to the device and the apparatus is included in the system which is configured to generate a number of control signals each corresponding to one of a number of positions of the substrate. The positioning device and the apparatus respond to the control signals to define an array of exposure fields on the substrate corresponding to the positions. The fields are arranged in at least two rows and two columns. The device further responds to the control signals to tilt the substrate a predetermined amount relative to the optical axis to focus a first part of the image with respect to the photoresist layer for each of the fields.

Accordingly, it is one object of the present invention to provide a system to evaluate lithography equipment.

It is another object of the present invention to provide a technique for evaluating characteristics of step and repeat lithography equipment that accounts for focus drift resulting from lens heating.

It is still another object of the present invention to determine best focus of step and repeat lithography equipment by a technique which accounts for focus variations under typical production conditions.

It is yet another object of the present invention to provide a technique for exposing each of a number of fields of a test substrate titled relative to an optical axis of a wafer stepper to evaluate focus.

Further, objects, features, aspects, advantages, and benefits of the present invention will become apparent from the description and drawings provided herewith.

DESCRIPTION OF THE PREFERRED EMBODIMENT

Figure 1:
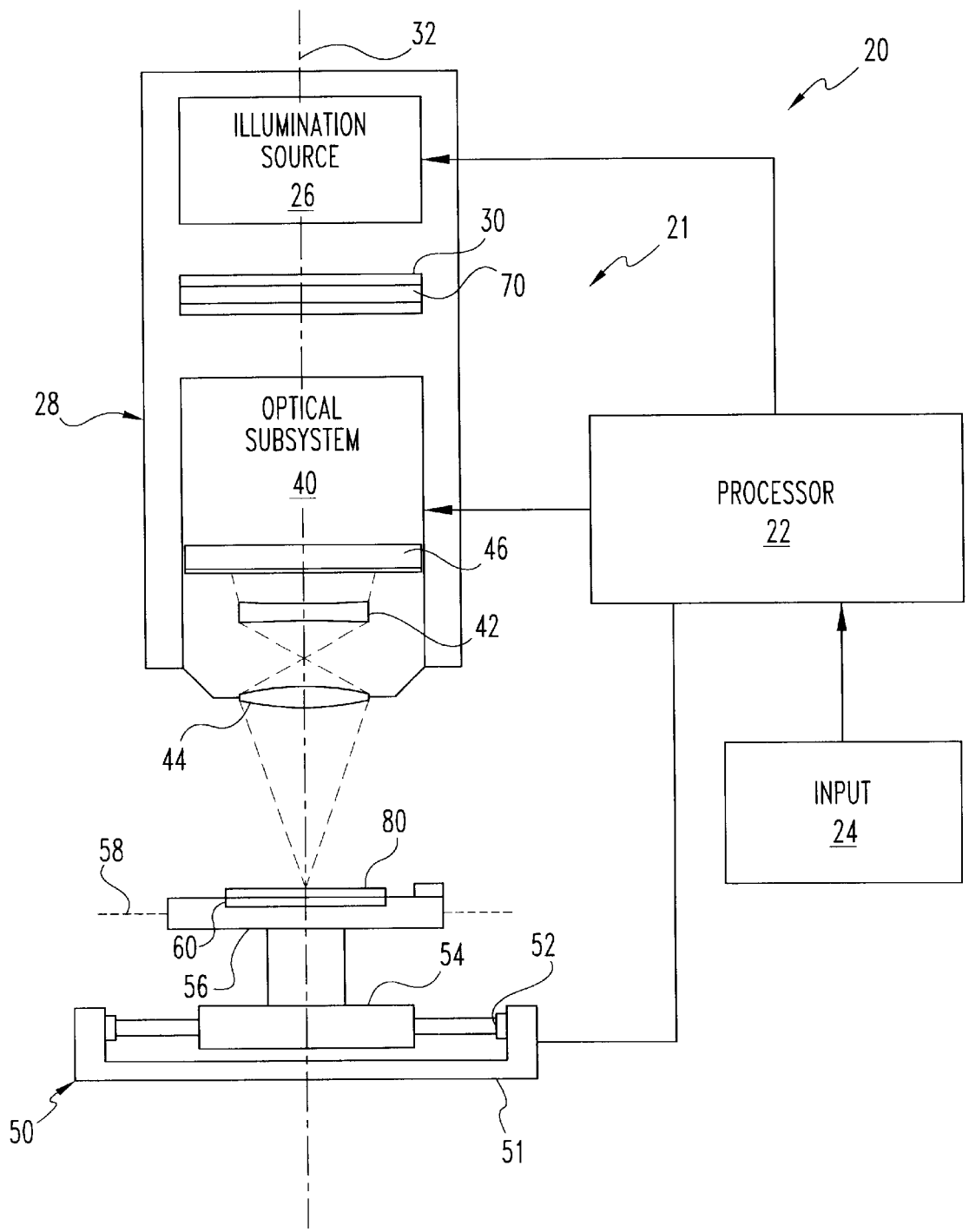
FIG. 1 is a schematic diagram of a step and repeat lithography equipment evaluation system of the present invention.

For the purposes of promoting an understanding of the principles of the invention, reference will now be made to the embodiment illustrated in the drawings and specific language will be used to describe the same. It will nevertheless be understood that no limitation of the scope of the invention is thereby intended. Any alterations and further modifications in the described device, and any further applications of the principles of the invention as described herein are contemplated as would normally occur to one skilled in the art to which the invention relates.

FIG. 1 depicts a step and repeat lithography equipment evaluation system 20. System 20 includes lithography device 21 which has a processor 22 operatively coupled to input device 24. Input device 24 is a keyboard, control panel, or such other apparatus as would occur to one skilled in the art to facilitate operator data input. Lithography device 21 also includes image projection apparatus 28 and multistage positioning device 50.

Image projection apparatus 28 includes illumination source 26 which provides electromagnetic radiation of a predetermined variety in response to control signals from processor 22 coupled thereto. Typically, the radiation from illumination source 26 is in the visible light or ultraviolet wavelength range. Image projection apparatus 28 also includes mask holder 30 aligned with illumination source 26. Mask holder 30 is configured to hold a mask pattern of opaque and transparent regions in the path of radiation from illumination source 26 to cast a desired image into optical subsystem 40. Optical subsystem 40 is also a part of image projecting apparatus 28 and is configured to project an image along optical axis 32. Optical subsystem 40 includes lenses 42 and 44 to properly focus a received image. Optical subsystem 40 also has a controlled shutter 46 coupled to processor 22 to selectively emit the image. Typically, optical subsystem 40 reduces the image size by a known factor relative to the size of the mask pattern. Image projection apparatus 28 may include additional components or otherwise be arranged as would occur to one skilled in the art.

Lithography device 21 also includes multistage positioning device 50. Device 50 is operatively coupled to processor 22 to be controlled thereby. Device 50 includes a base 51 and a wafer chuck 60 configured to securely hold a semiconductor wafer for lithographic processing by lithography device 21. Positioning apparatus 20 also has a number of independently controlled positioning stages to selectively position wafer chuck 60 relative to optical axis 32 of image projection apparatus 28.

Stage 52 of positioning device 50 positions wafer chuck 60 along a first axis ("X-axis") perpendicular to the view plane of FIG. 1. Stage 52 responds to a first axis control signal from processor 22 to provide a corresponding X-axis position of wafer chuck 60. Stage 54 positions wafer chuck 60 along a second axis ("Y-axis") generally perpendicular to the first axis. Stage 54 responds to a second axis control signal from processor 22 to provide a corresponding Y-axis position of wafer chuck 60. The second axis is generally parallel to the view plane of FIG. 1. Tilt stage 56 is configured to controllably pivot wafer chuck 60 about axis 58 in response to an appropriate tilt control signal from processor 22.

Preferably, lithography device 21 is of a conventional wafer stepper variety configured to mass produce integrated circuits by defining a matrix of spaced-apart exposure fields utilizing standard techniques. In one preferred embodiment, device 21 is a model FPA-3000i4 5xi-line stepper supplied by Canon U.S.A., Incorporated of 3200 Regent Blvd., Irving Tex. 75063-3145.

Figure 2:
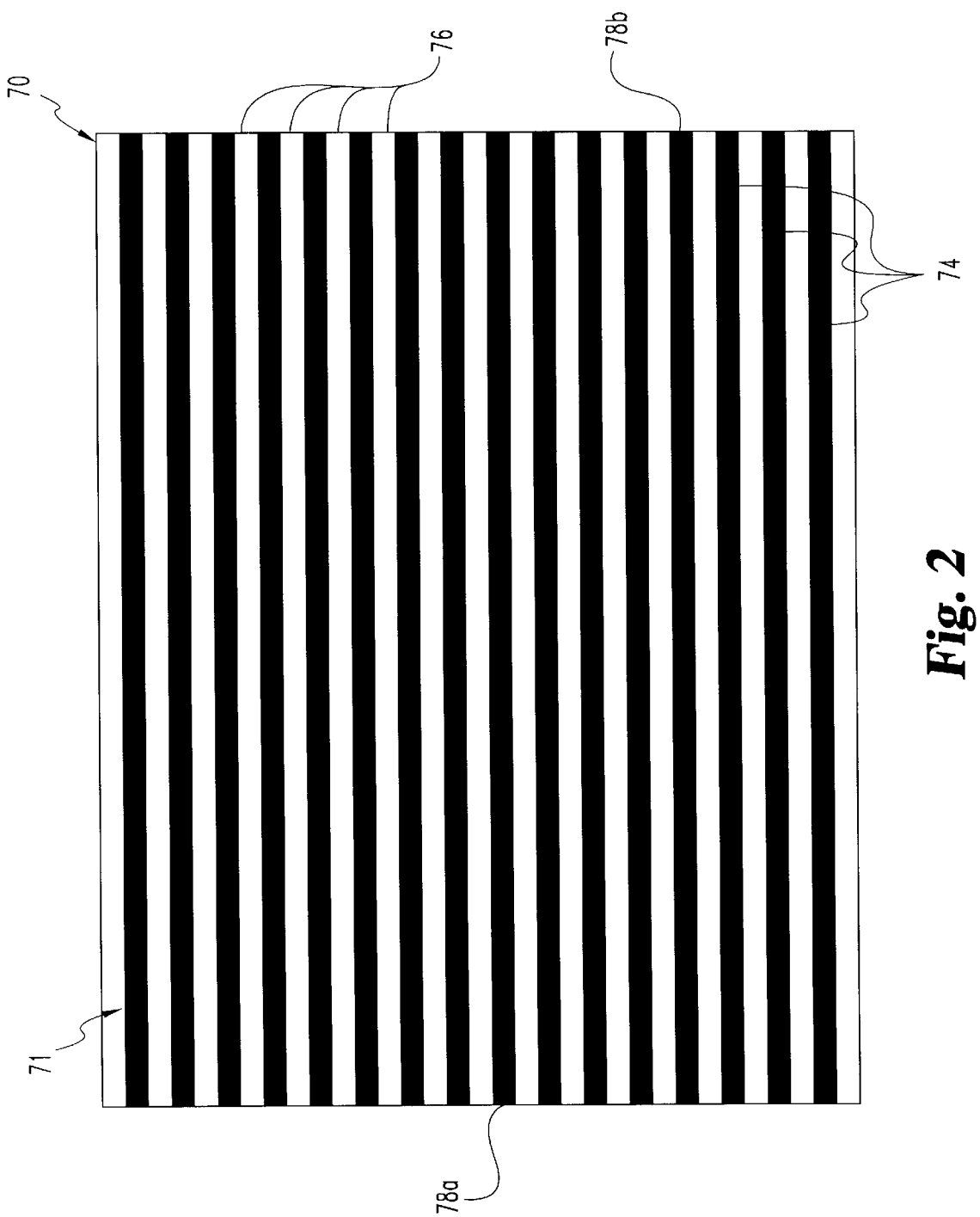
FIG. 2 is a diagramatic representation of a reticle mask for the system of FIG. 1.

To facilitate evaluation of various optical characteristics of device 21, system 20 includes reticle mask 70 secured in holder 30, and test wafer 80 secured by wafer chuck 60. Referring additionally to FIG. 2, reticle mask 70 is generally rectangular and defines a grating pattern 71. Pattern 71 includes masking lines or bars 74 regularly spaced apart from one another to define generally uniform longitudinal gaps 76 therebetween. Lines 74 are generally parallel to each other and longitudinally extend from end 78a to end 78b.

Figure 3:
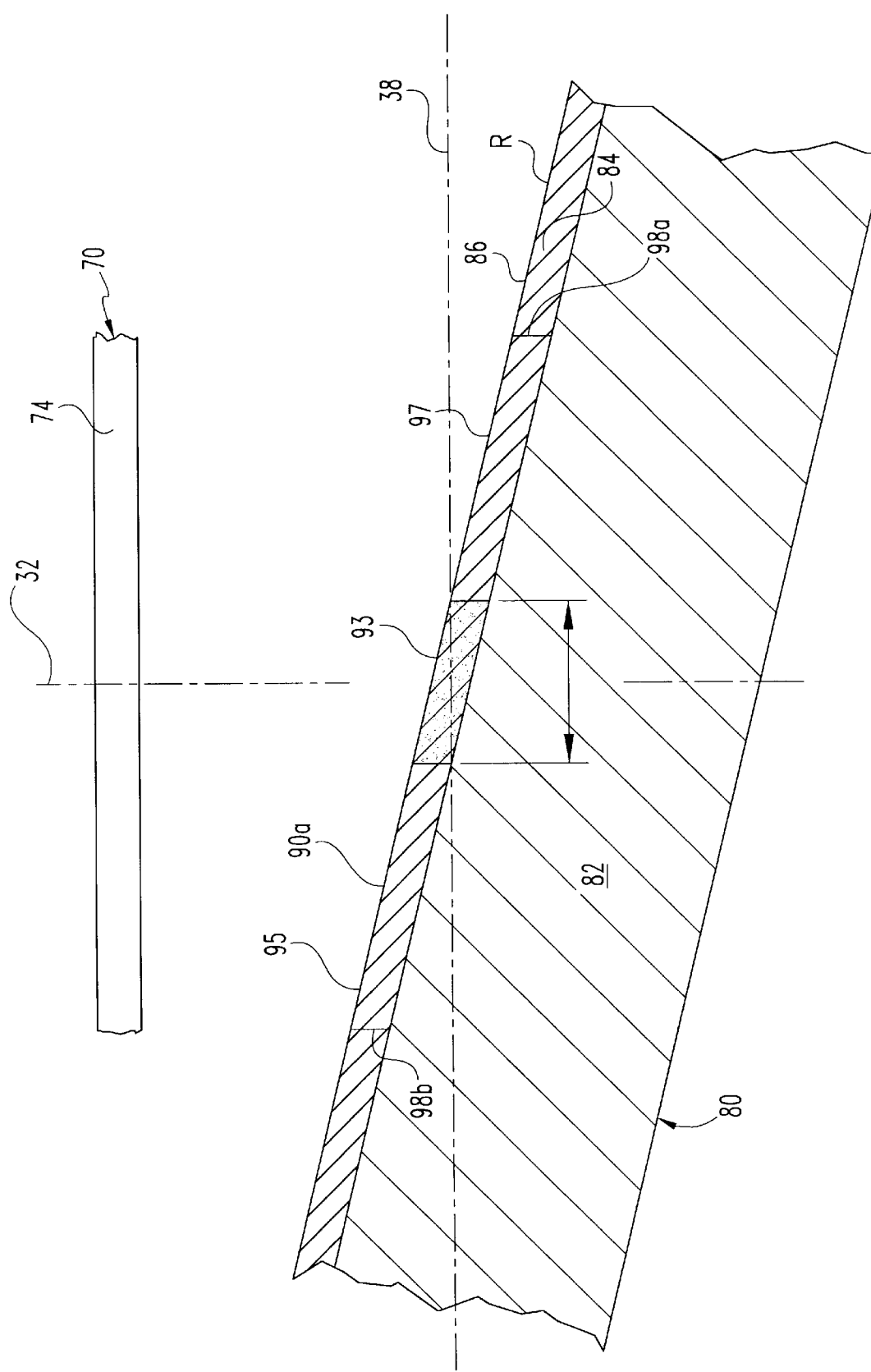
FIG. 3 is a partial schematic diagram illustrating the reticle mask of FIG. 2 relative to a tilted test wafer.

In addition, FIG. 3 provides a partial side view of a typical one of lines 74. The view plane of FIG. 3 is generally parallel to lines 74. FIG. 3 also depicts test wafer 80 which is inclined relative to optical axis 32. Other components of system 20 are not shown in the diagramatic illustration of FIG. 3 to preserve clarity.

As depicted in FIG. 3, test wafer 80 includes substrate 82 coated with photoresist layer 84. Photoresist layer 84 defines exposure surface 86. Preferably, the configuration of wafer 80 is typical of the type used to manufacture ICs with lithography device 21. Notably, the incline of wafer 80 results in tilting photoresist layer 84 and exposure surface 86 relative to image plane 38 of apparatus 28. Image plane 38 defines the plane along optical axis 32 at which apparatus 28 projects an in-focus image corresponding to reticle mask 70. Consequently, the position of image plane 38 along optical axis 32 is indicative of focus of lithography device 21. Image plane 38 is represented by a dash line in FIG. 3 and is generally perpendicular to optical axis 32 and the view plane of FIG. 3.

Figure 4:
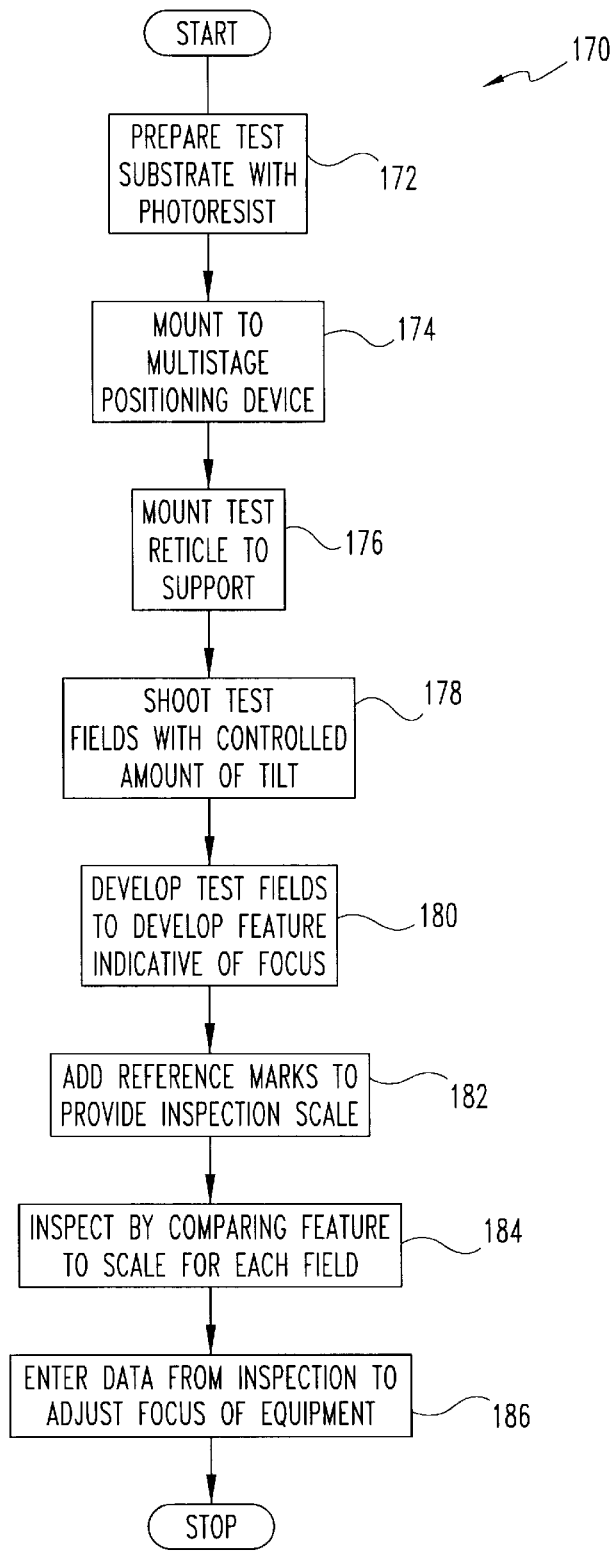
FIG. 4 is a flow diagram illustrating an evaluation process of the present invention.

FIG. 4 depicts process 170 of the present invention for evaluating optical characteristics of lithography device 21. Process 170 starts with operation 172 during which substrate 82 is coated with photoresist layer 84 in a conventional manner to provide test wafer 80. Test wafer 80 is then mounted to wafer chuck 60 of multistage positioning device 50 in operation 174. In operation 176, reticle mask 70 is mounted to holder 30 of apparatus 28.

In operation 178, an array of test fields are defined by lithography device 21. Each field is defined by a step and repeat exposure cycle programmed into processor 22. For each cycle, processor 22 sends an appropriate sequence of first and second axis control signals to stages 52 and 54, respectively. In response, positioning device 50 aligns a selected region of wafer 80 with optical axis 32. Processor 22 is also programmed to send a tilt control signal to stage 56 to provide a predetermined amount of tilt for the given X-Y position. Once a field is positioned and tilted, processor 22 generates an exposure signal to trigger shutter 46, exposing the aligned region to define a test field. This exposure cycle is successively repeated until all test fields of the array are defined.

Preferably, the test fields are uniformly spaced-apart from each other and have the same size, shape, and arrangement as IC die fields defined by lithography device 21 during production runs. More preferably, substantially the same degree of tilt is maintained for each of the test fields, and the test fields are generally evenly spaced-apart from each other in an "m" row by "n" column (m×n) matrix. In this more preferred embodiment, operating conditions—such as temperature, humidity, exposure timing, and the step and repeat pattern—duplicate as closely as possible the conditions for production processing of integrated circuit patterns with lithography device 21.

In FIG. 3, a side view of test field 90a extends from field end 98a to field end 98b. Test field 90a is defined by the image of reticle mask 70 projected on photoresist layer 84 during an exposure cycle. It should be understood that test field 90a size is ordinarily reduced relative to the reticle mask 70 size by a known factor through optical subsystem 40. Notably, only a portion of the generally horizonal image plane 38 intersects the tilted photoresist layer 84. As a result, reticle mask 70 only blocks exposure of photoresist layer 84 to electromagnetic radiation from source 26 for a focused region 93 of field 90*a*. Image plane 38 lies behind photoresist layer 84 for a defocused region 95. Also, a defocused region 97 of field 90*a* corresponds to a part of image plane 38 in front of photoresist layer 84. As a result of being out-of-focus, defocused regions 95 and 97 are exposed to electromagnetic radiation from illumination source 26 during an exposure cycle. Reticle mask 70 and wafer 80 are configured for processing in accordance with a positive photoresist technique. Consequently, regions 95 and 97 of photoresist layer 84 are photochemically altered by exposure in a manner to facilitate removal.

Figure 5:
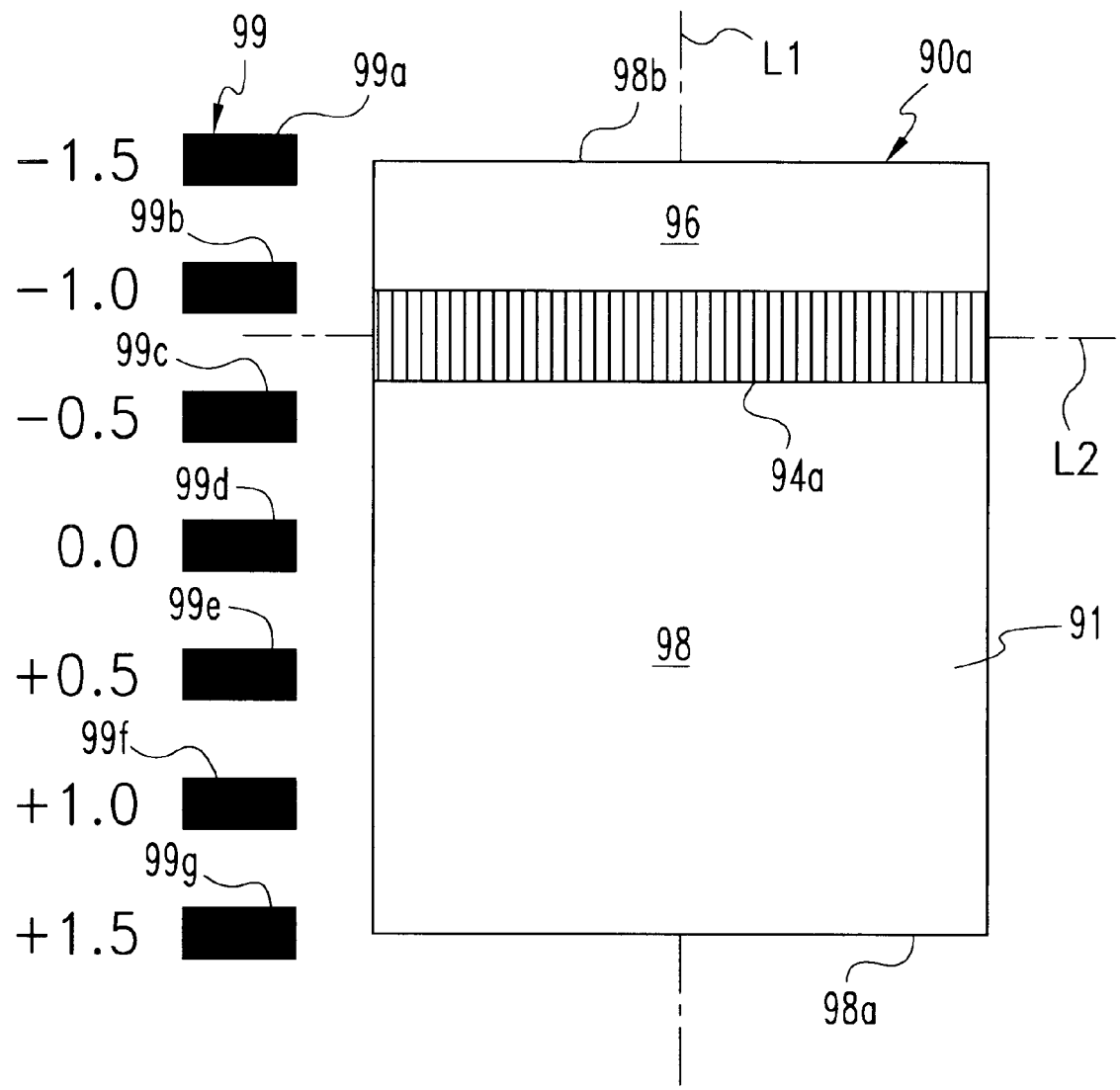
FIG. 5 is a test field provided by the process depicted in FIG. 4.

For operation 180, wafer 80 is removed from device 21. Wafer 80 is then processed using standard lithographic development techniques to define a pattern corresponding to the focused region 93 and defocused regions 95 and 97 of field 90*a*. This operation also defines a generally rectilinear outline of test field 90*a* corresponding to exposure boundries. Referring additionally to FIG. 5, a top view of field 90*a* is provided after operation 180 is complete. Notably, field 90*a* has a length along longitudinal axis L1 extending from end 98*a* to end 98*b*. Pattern 91 of field 90*a* has a feature 94*a* spanning thereacross. Feature 94*a* corresponds to focused region 93. Feature 94*a* includes linear segments corresponding to a focused portion of the image of lines 74. Notably, reticle 70 is oriented so that image lines corresponding to lines 74 are generally parallel to longitudinal axis L1.

Feature 94*a* has a length along longitudinal axis L2. In embodiments where the grating pattern 71 dimensions are comparable to the wavelength of illuminating radiation, feature 94*a* may alternatively appear as a solid bar along axis L2. Axis L2 is generally perpendicular to axis L1 and generally parallel to axis 58 about which field 90*a* is pivoted in order to provide the desired amount of tilt relative to image plane 38 and optical axis 32. Part 96 above feature 94*a* and part 98 below feature 94*a* correspond to defocused regions 95 and 97 of field 90*a* from which material has been accordingly removed through operation 180.

In operation 182, a numbered scale 99 with reference marks 99*a*–99*g* is added adjacent an edge of test field 90*a*. Reference marks 99*a*–99*g* may be added through a screening process, printing process, inspection overlay, or using such other techniques as would occur to those skilled in the art. In addition, numerical identifiers corresponding to scale 99 are illustrated which may be provided by an overlay or through such other means as would occur to one skilled in the art. Scale 99 facilitates inspection of test field 90*a* to gather optical data regarding lithography device 21.

In one embodiment, numbered scale 99 indexes the distance along optical axis 32 occupied by test field 90*a* when tilted. It should be appreciated that this distance varies with the amount of tilt of field 90*a*. By determining the position of feature 94*a* along scale 99 relative to a reference point along optical axis 32, corresponding focus information for test field 90*a* may be quantified. In the case of the aforementioned Canon model FPA-3000i4 5×i-line stepper embodiment, the numerical identifiers of scale 99 may represent a 3 micron ($\mu$m) segment along optical axis 32 corresponding to the degree of tilt. This 3 $\mu$m segment is scaled from −1.5 to +1.5 microns about a reference focal point along optical axis 32. For this embodiment, marker 99*d* numbered 0.0 represents this reference focal point, the negative numbers of markers 99*a*, 99*b*, 99*c* correspond to the distance the reference focal point extends below the test field along optical axis 32, and the positive numbers of markers 99*e*, 99*f*, 99*g* correspond to the distance the reference focal point is positioned above test field 90*a* along optical axis 32. As a result, feature 94*a* is displaced from the reference focal point by a distance between −1.0 and −0.5 microns for this embodiment.

Figure 6:
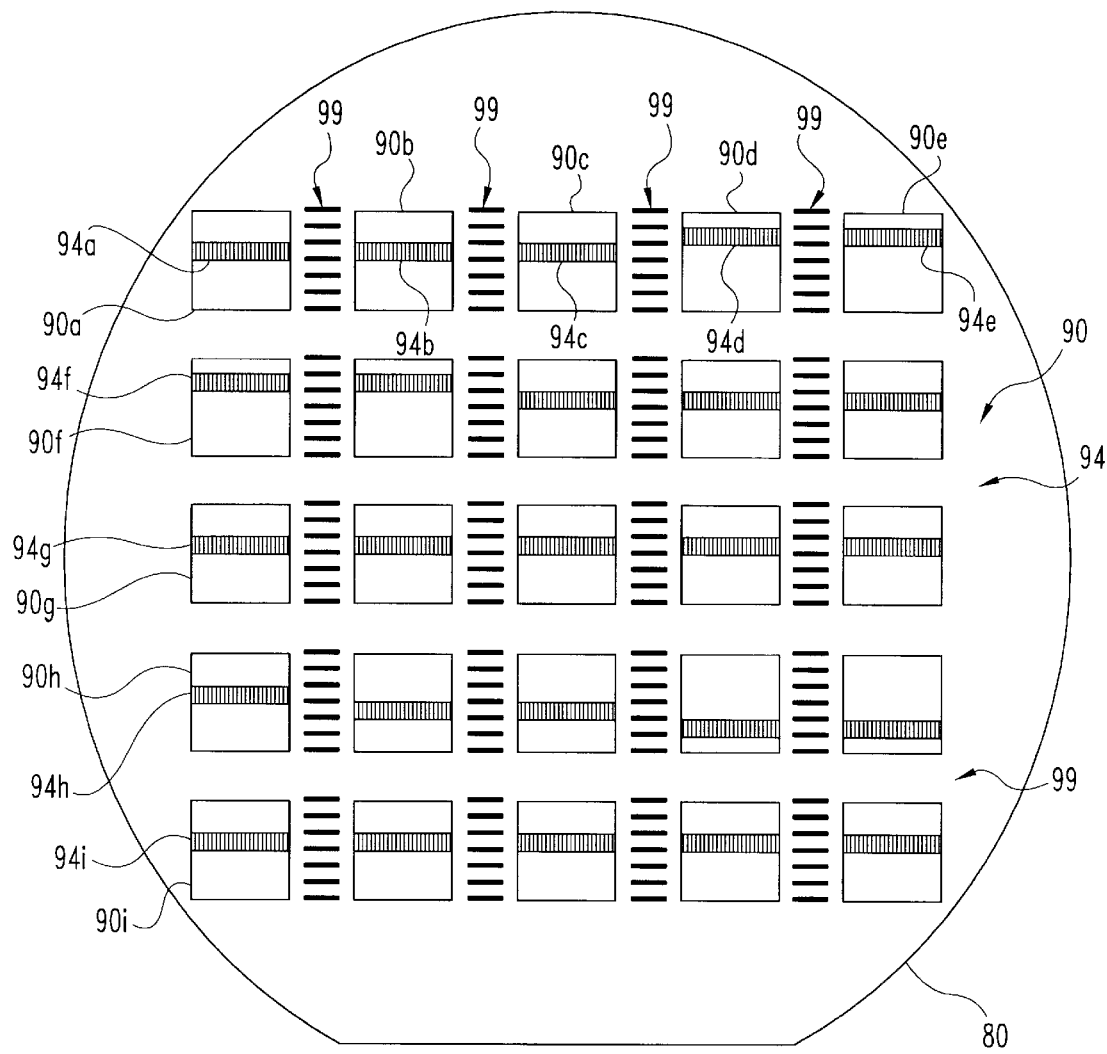
FIG. 6 is a developed test wafer provided by the process depicted in FIG. 4.

Referring additionally to FIG. 6, wafer 80 is shown after processing through operation 182. A matrix 99 of regularly spaced test fields organized in five rows and five columns (5×5) is depicted. Matrix 99 designates field 90*a* as part of a first row including fields 90*a*–90*e*. A first column of fields are also specifically designated as 90*a* and 90*f*–90*i*. Collectively, these fields are referred to as fields 90. Corresponding scales 99 are also selectively designated. Further fields and scales were not specifically designated in FIG. 6 to preserve clarity. Features 94*a*–94*i* correspond to test fields 90*a*–90*i* and are collectively referred to as features 94. Notably, the position of features 94 relative to scale 99 varies despite a generally constant degree of tilt relative to optical axis 32 for each field. Because features 94 correspond to coincident regions of image plane 38 and photoresist layer 84, features 94 provide information pertinent to the focus properties of lithography device 21. Moreover, these properties closely simulate variations expected during production wafer processing.

The position of each feature 94 within a corresponding test field 90 is evaluated during inspection operation 184. Scale 99 may be used to provide a relative quantitative measure. As depicted in FIG. 5, reference scale 99 has a center mark 99*d* of 0.0 which generally provides a relative focus standard for device 21. The negative and positive portions of scale 94; marks 99*a*–99*c* and 99*e*–99*g*, respectively; correspond to focus variations resulting from a shift of the image plane 38 relative to the center mark 99*d*. The visual inspection of operation 184 may be performed without aid or by employing magnification apparatus as required. In either case, inspection may be performed quickly to obtain a measure of focus variation for the entire test wafer 80. Although it is preferred that the same tilt amount be used for each field 90, tilt amount may be controllably varied from one field to the next by a known amount and inspection data adjusted accordingly.

During operation 186, quantative data representative of the relative position of features 94 within the corresponding test fields may be entered into processor 22 with input device 24 to facilitate focus correction. This focus information may be averaged or otherwise statistically treated in a manner known to those skilled in the art to obtain "best focus" of device 21. Also, the focus information obtained from inspection may be compared to a standard data set to evaluate focus drift. Furthermore, the dimensions (or "thickness") of each feature 94 along axis L1 is indicative of the depth of focus of device 21 for the given amount of tilt.

In one preferred embodiment, a grating pattern 71 of about 62,857 lines each having a width of about 0.35 $\mu$m are employed. These lines have center-to-center spacing of about 0.70 $\mu$m. For this embodiment, the field size is about 22 mm by 22 mm and the number of fields are processed in 5 rows by 5 columns on a 6 inch wafer. Each field is tilted to occupy about 3 $\mu$m along optical axis 32. This 3 $\mu$m segment is indexed by scale 99 from −1.5 microns to +1.5 microns about a reference focal point corresponding to marker 99*d* (numbered 0.0). Using this index, the position of feature 94 along scale 99 is quantified for each test field 90 to obtain focus evaluation data. Best focus is generated from this inspection data. The aforementioned Cannon model FPA-3000i4 5×i-line stepper is employed as device 21 with appropriate programming to perform the technique of the present invention for this embodiment.

For other embodiments, the present invention may be utilized to evaluate optical characteristics of other wafer stepper arrangements known to those skilled in the art. Also, the present invention may be used as a supplement or alternative to existing focus evaluation schemes. In still other embodiments, a negative instead of positive lithographic process may be employed such that features 94 correspond to removed photoresist material. Furthermore, the test reticle pattern 71 may be varied as would occur to one skilled in the art without departing from the spirit of the present invention.

It is contemplated that various operators, operations, stages, conditionals, procedures, thresholds, and processes described in connection with the present invention could be altered, rearranged, substituted, deleted, duplicated, combined, or added to other processes as would occur to those skilled in the art without departing from the spirit of the present invention.

Processor 22 may be an electronic circuit comprised of one or more components. Similarly, processor 22 may be comprised of digital circuitry, analog circuitry, or both. Also, processor 22 may be programmable, an integrated state machine, or a hybrid combination thereof. Preferably processor 22 is a solid state microprocessor-based controller of a known construction. Controlled movement of stages 52, 54, 56 and shutter 46 in response to signals from processor 22 is provided through conventional electromechanical actuators coupled to processor 22, or such other types of devices as would occur to those skilled in the art.

All publications, patents, and patent applications cited in this specification are herein incorporated by reference as if individual publication, patent, or patent application were specifically and individually indicated to be incorporated by reference and set forth in its entirety herein.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. A method, comprising:
   (a) successively exposing a number of locations on a photoresist layer to an image projected with an integrated circuit lithography device to define a corresponding array of exposed fields, the layer being inclined a predetermined amount relative to an optical axis of the device during said exposing to focus only a portion of the image on the layer for each of the fields;
   (b) processing the layer to provide a pattern corresponding to the portion of the image focused on the layer for each of the fields; and
   (c) determining an optical characteristic of the device from inspection of the pattern for each of the fields after said processing.

2. The method of claim 1, further comprising establishing a number of reference marks adjacent each of the fields.

3. The method of claim 1, further comprising supporting the layer with a substrate and tilting the substrate to incline the layer relative to the optical axis.

4. The method of claim 1, wherein the array is arranged in a matrix of at least four rows and at least four columns.

5. The method of claim 1, wherein said determining includes:
   (c1) comparing the pattern of each of the fields to a standard representative of device focus; and
   (c2) determining a number of values corresponding to focus of the device for each of the fields from said comparing; and
   (c3) characterizing best focus of the device as a function of the values.

6. The method of claim 1, wherein the image includes a grating pattern oriented along a first axis, the photoresist is positive to provide a feature after said processing representative of the portion of the image focused on the layer, and the feature has a longitude along a second axis generally perpendicular to the first axis.

7. The method of claim 6, wherein at least one dimension of the feature corresponds to depth of focus for the device.

8. The method of claim 1, wherein said exposing includes:
   (a1) blocking radiation on a first part of each of the fields, the first part corresponding to the portion of the image focused on the layer; and
   (a2) irradiating a second part of each of the fields, the image being unfocused relative to the layer for the second part.

9. A combination, comprising:
   providing a substrate having a photoresist surface for treatment by integrated circuit lithography equipment;
   activating the equipment to focus a first part of an image on a region of the surface and defocus a second part of the image relative to the region, the region being tilted relative to an image plane defined by the equipment;
   repeating said activating for each of a number of space-apart regions along the surface;
   processing the substrate to provide a pattern for each of the regions corresponding to the first and second parts; and
   characterizing the equipment from the pattern for each of the regions.

10. The combination of claim 9, further comprising focusing the equipment in accordance with said characterizing.

11. The combination of claim 9, wherein said activating includes positioning a support for the substrate, the support position being adjustable along each of three mutually perpendicular axes.

12. The combination of claim 9, wherein said repeating is performed to consecutively expose each of the regions in a step and repeat procedure to define an array of spaced apart exposure fields having at least two rows and at least two columns.

13. The combination of claim 9, wherein said characterizing includes:
   comparing the pattern of each of the regions to a standard;
   determining a number of values corresponding to focus of the equipment for each of the regions from said comparing; and
   establishing best focus of the equipment as a function of the values.

14. The combination of claim 9, wherein the second part includes a first portion and a second portion, the first part being positioned between the first and second portions.

15. The combination of claim 9, wherein the regions each include a feature after said processing, and the feature has a position which varies in accordance with focus of the equipment.

16. The combination of claim 15, further comprising providing a number of reference marks to evaluate the position of the feature for each of the regions.

17. The combination of claim 15, wherein the image includes a grating oriented along a first axis, the photoresist is positive to provide the feature after said processing, the feature corresponds to the first part of the image, and the feature has a longitude along a second axis generally perpendicular to the first axis.

18. The combination of claim 9, wherein the first part of the image corresponds to a first portion of the region and the second part of the image corresponds to a second portion of the region, and the first part prevents exposure radiation from reaching the first portion and the second part permits irradiation of the second portion.

19. A combination, comprising:

mounting a substrate with a photoresist surface on a step and repeat lithography device used to manufacture integrated circuits;

defining an array of test fields with the device when the surface is tilted by a predetermined amount relative to an image plane of the device, the fields each being exposed to an image during said defining with only a portion of the image being focused on the surface;

processing the array to provide a corresponding set of patterns each having an element corresponding to an in-focus portion of the image; and inspecting the array to evaluate an optical characteristic of the device.

20. The combination of claim 19, further comprising establishing a number of reference marks on the substrate adjacent the area.

21. The combination of claim 19, wherein said defining includes positioning a substrate supporting the surface, the substrate position being adjustable along each of three mutually perpendicular axes.

22. The combination of claim 19, wherein the optical characteristic includes focus of the device.

23. The combination of claim 19, wherein the image is provided by a reticle mask having a number of spaced apart lines.

24. The combination of claim 19, wherein the image includes a grating oriented along a first axis and the patterns each include a feature that has a longitude along a second axis generally perpendicular to the first axis.

25. The combination of claim 24, further comprising pivoting the surface about a third axis generally parallel to the second axis.

26. The combination of claim 19, wherein the patterns each include a first portion corresponding to an in-focus portion of the image, the first portion is positioned between a second portion and a third portion, and the second and third portions correspond to portions of the image that are out-of-focus.

27. The combination of claim 19, wherein each of the patterns defines a feature that corresponds to depth of focus of the device.

28. A combination, comprising:

exposing photoresist on a substrate to an image projected with lithography equipment along an optical axis;

controllably tilting the substrate relative to the axis, the substrate being tilted during said exposing to focus a first part of the image on the photoresist and defocus a second part of the image relative to the photoresist;

processing the photoresist to provide a pattern corresponding to the first and second parts;

establishing a number of reference marks to determine position of a feature defined by the pattern; and inspecting the pattern relative to the marks to determine an optical characteristic of the equipment.

29. The combination of claim 28, wherein the optical characteristic includes focus of the equipment.

30. The combination of claim 28, further comprising establishing an array of exposure fields on the surface when the substrate is tilted, and wherein:

said processing includes developing the array to provide a corresponding set of patterns each having an element corresponding to an in-focus portion of the image; and said inspecting includes evaluating the array after said processing.

31. The combination of claim 28, wherein the image includes a grating pattern oriented along a first axis and the feature has a longitude along a second axis generally perpendicular to the first axis.

32. The combination of claim 31, wherein said tilting includes pivoting the substrate about a third axis generally parallel to the second axis.

33. The combination of claim 28, wherein the second part of the image includes a first portion and a second portion, and the first part of the image is positioned between the first and second portions.

34. An evaluation system, comprising:

(a) a controllable positioning device configured to receive a test substrate having a photoresist layer;

(b) a controllable image projection apparatus configured to project an image along an optical axis and onto the photoresist layer when said device receives the substrate;

(c) a processor operatively coupled to said device and said apparatus, said processor being configured to generate a number of control signals each corresponding to one of a number of positions of the substrate; and wherein said positioning device and said apparatus respond to said control signals to define an array of exposure fields on the substrate corresponding to the positions, the fields being arranged in at least two rows and at least two columns, the device further responding to the control signals to tilt the substrate a predetermined amount relative to the optical axis to focus a first part of the image on the photoresist layer and defocus a second part of the image for each of the fields.

35. The system of claim 34, wherein said device is configured to position the substrate with respect to each of three mutually perpendicular axes.

36. The system of claim 34, wherein said apparatus includes:

a reticle mask with a test pattern corresponding to the image;

a radiation source configured to provide radiation through said reticle mask; and a lens arrangement to project the image from said reticle mask along an image plane generally perpendicular to the optical axis of said apparatus.

37. The system of claim 36, wherein the test pattern defines a grating pattern oriented along a first axis, and the feature has a longitude along a second axis generally perpendicular to the first axis.

38. The system of claim 36, wherein said processor is responsive to entry of data obtained from inspection of the feature of each of the fields to focus said apparatus.

* * * * *